United States Patent
Sun et al.

(10) Patent No.: US 8,609,475 B2
(45) Date of Patent: Dec. 17, 2013

(54) METHODS FOR FORMING NICKEL OXIDE FILMS FOR USE WITH RESISTIVE SWITCHING MEMORY DEVICES/US

(75) Inventors: Zhi-Wen Sun, Sunnyvale, CA (US); Tony Chiang, Campbell, CA (US); Chi-I Lang, Cupertino, CA (US); Jinhong Tong, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/602,637

(22) Filed: Sep. 4, 2012

(65) Prior Publication Data

US 2013/0230962 A1   Sep. 5, 2013

Related U.S. Application Data

(63) Continuation of application No. 11/963,656, filed on Dec. 21, 2007, now Pat. No. 8,283,214.

(51) Int. Cl.
*H01L 21/20* (2006.01)
*H01L 21/00* (2006.01)
*H01L 21/16* (2006.01)
*H01L 21/8229* (2006.01)

(52) U.S. Cl.
USPC .................... 438/141; 438/104; 257/E21.613

(58) Field of Classification Search
USPC .................................................. 438/104, 141
See application file for complete search history.

(56) References Cited

U.S. PATENT DOCUMENTS 6,878,247 B2 * 4/2005 Duruz et al. .................. 204/293
2006/0215445 A1 * 9/2006 Baek et al. .................... 365/158

* cited by examiner

*Primary Examiner* — Calvin Choi

(57) ABSTRACT

Methods for forming a NiO film on a substrate for use with a resistive switching memory device are presenting including: preparing a nickel ion solution; receiving the substrate, where the substrate includes a bottom electrode, the bottom electrode utilized as a cathode; forming a $Ni(OH)_2$ film on the substrate, where the forming the $Ni(OH)_2$ occurs at the cathode; and annealing the $Ni(OH)_2$ film to form the NiO film, where the NiO film forms a portion of a resistive switching memory element. In some embodiments, methods further include forming a top electrode on the NiO film and before the forming the $Ni(OH)_2$ film, pre-treating the substrate. In some embodiments, methods are presented where the bottom electrode and the top electrode are a conductive material.

20 Claims, 6 Drawing Sheets

METHODS FOR FORMING NICKEL OXIDE FILMS FOR USE WITH RESISTIVE SWITCHING MEMORY DEVICES/US

CROSS-REFERENCE TO RELATED APPLICATIONS

This application is a continuation of U.S. patent application Ser. No. 11/963,656, entitled "METHODS FOR FORMING NICKEL OXIDE FILMS FOR USE WITH RESISTIVE SWITCHING MEMORY DEVICES," filed on Dec. 21, 2007, which is incorporated herein by reference in its entirety for all purposes.

BACKGROUND

Non-volatile memory devices based on the resistivity switching of transition-metal oxide materials has become a major focus for developing the next generation universal RAM devices. As may be appreciated, non-volatile memory does not require a constant power supply to retain stored information in contrast to volatile memory, which does require a constant power supply to retain stored information. Thus, non-volatile memory may have advantages for long term storage of critical data.

Many types of materials have been utilized to create non-volatile memory elements. Nickel oxide thin films are one such material. Conventionally, nickel oxide thin films have been prepared through physical-vapor deposition (PVD) methods by reactive sputtering of Ni targets in an $O_2$ enriched environment. In addition, in some examples, conventional methods have generated reproducible resistance switching in an appropriate metal-insulator (NiO thin film)-metal structure with superior performances both in terms of reliability and speed.

Research of nickel oxide thin films has demonstrated that the defect chemistry of those films can play a role in determining the switching performance of the associated memory devices derived from those films. For example, according to some research, the atomic elemental ratio between nickel and oxygen must be carefully controlled to within certain ranges to obtain a desired resistance switching. Current deposition techniques may not provide sufficiently precise control over chemical defects in oxide materials.

As such, methods for forming nickel oxide films for use with resistive switching memory devices are presented herein.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The illustrative examples presented herein are for clarifying embodiments of the present invention. Theses illustrations are not scale representations of embodiments and should not be construed as so limiting with respect to scale and proportion. In addition, the illustrations provided may, in some examples, represent only a portion of an integrated memory device for clarity. Thus, substrates, dielectric materials, conductive materials, semiconductor features, semiconductor devices, or other associated elements or devices may be specifically excluded for the sole purpose of presenting simplified embodiments.

Non-volatile memory devices based on the resistivity switching of transition-metal oxide materials has been a major focus for developing the next generation universal RAM devices. NiO-based oxide thin films prepared from physical-vapor deposition (PVD) methods by reactive sputtering of Ni targets in $O_2$-containing environments have been demonstrated to be able to generate reproducible resistance switching in an appropriate metal-insulator (NiO thin film)-metal structure. Further, it has been established that the defect chemistry of NiO may play a role in determining the switching performance of NiO thin films. In particular, the atomic elemental ratio between Ni and O can be controlled within certain ranges to obtain the resistance switching. However, in some implementations PVD exhibits poor control over the chemical defects in oxide materials. In addition, PVD can be an expensive deposition method due to the complexity of the PVD equipment and associated consumable parts. Therefore, low-cost chemical deposition methods that can generate NiO films with well-controlled chemical defect levels for the non-volatile memory application may be desirable.

Figure 1A:
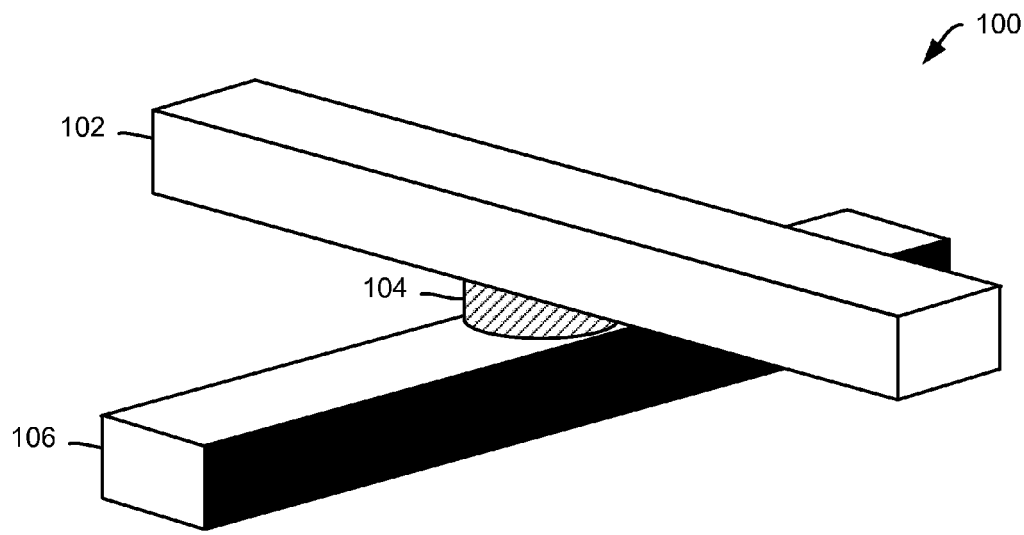
FIG. 1A is an illustrative perspective representation of a resistive switching memory element in accordance with embodiments of the present invention.

FIG. 1A is an illustrative perspective representation of a resistive switching memory device 100 in accordance with embodiments of the present invention. As illustrated, NiO film 104 is disposed on electrode 106. Electrode 106 provides a first conductive element for resistive switching memory element 100. In some embodiments, NiO films may be electrochemically deposited on electrodes utilizing methods provided herein. Electrode 102 provides a second conductive element for resistive switching memory element 100. In some embodiments, electrodes may be formed from Ni, Pt, Ir, Ti, Al, Cu, Co, Ru, Rh, and their alloys. In addition, in some embodiments, NiO film 104 may include a dopant or alloying element such as Co, Li, Mg, and Cr. Dopants, as may be appreciated, may be selected to provide specific and desired switching characteristics for a memory device.

It may be appreciated that electrodes 102 and 106 may be formed in any manner well-known in the art without departing from the present invention including: PVD, CVD, ALD, ECP, and Electroless deposition techniques. In general, memory device 100 forms a memory element equal to one bit. The memory element may have a value of 0 or 1 depending on the resistance across the element. For example, when the resistance across the element is high (e.g., 10 kOhm), the element has a value of 0, and when the resistance is low (e.g., 1 kOhm), the element has a value of 1. The resistance of the element can be changed by changing the resistance of the NiO film 104, which can be changed by applying a voltage across the element (e.g., one voltage to change to a 0, and another voltage to change to 1). The element's value (i.e., resistance) may be determined by using a read voltage that does not disturb the state of the element.

Figure 1B:
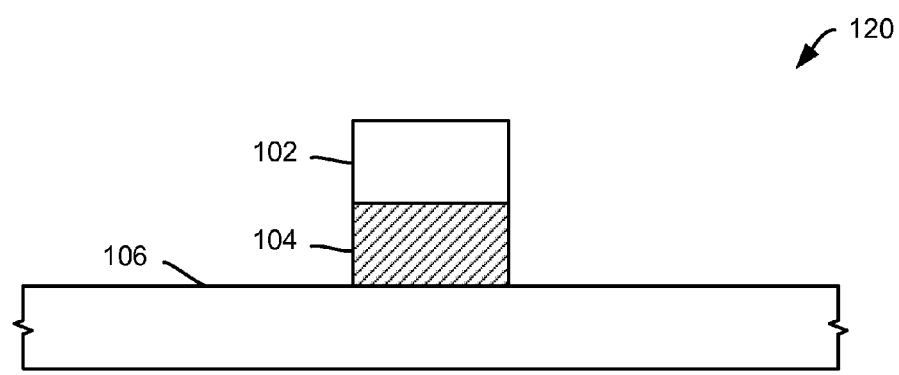
FIG. 1B is an illustrative cross-sectional representation of a resistive switching memory element in accordance with embodiments of the present invention.

FIG. 1B, which corresponds with FIG. 1A, is an illustrative cross-sectional representation of a resistive switching memory element 120 in accordance with embodiments of the present invention. As above, resistive switching memory element 120 includes electrode 106, NiO film 104, and electrode 102. In some embodiments, a buffer layer (not shown) may be formed on NiO film 104 to provide adhesion enhancement and a diffusion barrier.

Figure 2A:
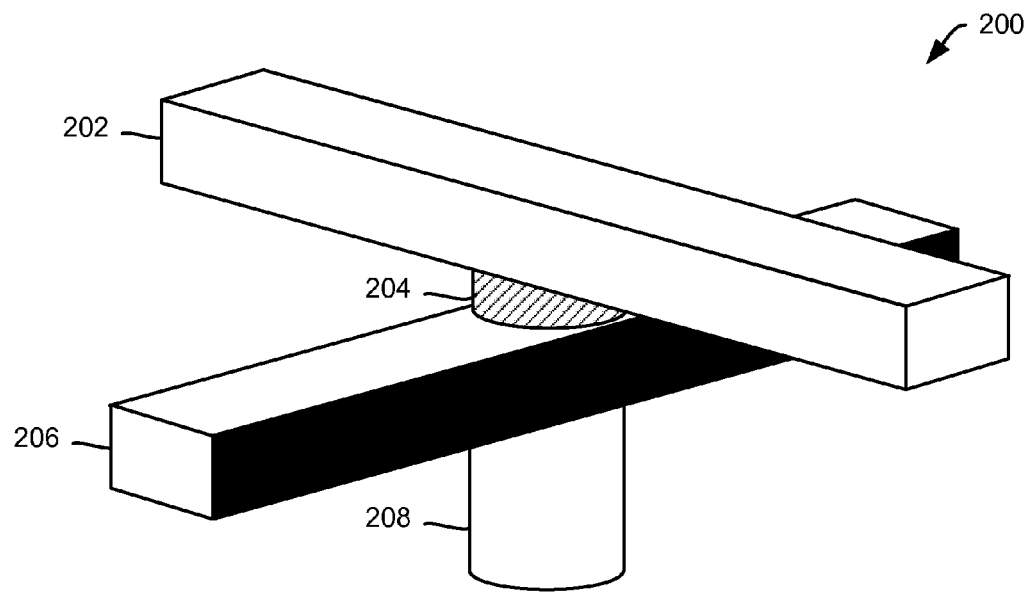
FIG. 2A is an illustrative perspective representation of a resistive switching memory element in accordance with embodiments of the present invention.
Figure 2B:
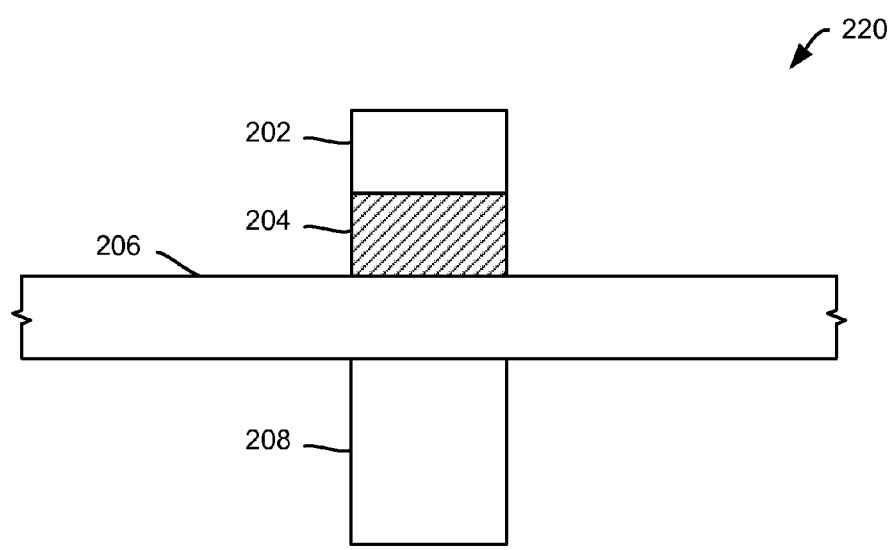
FIG. 2B is an illustrative cross-sectional representation of a resistive switching memory element in accordance with embodiments of the present invention.

FIG. 2A is an illustrative perspective representation of a resistive switching memory element in accordance with embodiments of the present invention. As illustrated, NiO film 204 is disposed on electrode 206. Electrode 206 provides a first conductive element for resistive switching memory element 200. In some embodiments, NiO films may be electrochemically deposited on electrodes utilizing methods provided herein. Electrode 202 provides a second conductive element for resistive switching memory element 200. In some embodiments, electrodes may be formed from Ni, Pt, Ir, Ti, Al, Cu, Co, Ru, Rh, and their alloys. In addition, in some embodiments, NiO film 204 may include a dopant or alloying element such as Co, Li, Mg, and Cr. Dopants, as may be appreciated, may be selected to provide specific and desired switching characteristics for a memory device. It may be appreciated that electrodes 202 and 206 may be formed in any manner well-known in the art without departing from the present invention including: PVD, CVD, ALD, ECP, and electroless deposition techniques. In addition, in some embodiments, resistive memory element 200 may further include current steering element 208, which may include a diode, a resistor, or a transistor. FIG. 2B, which corresponds with FIG. 2A, is an illustrative cross-sectional representation of a resistive switching memory element 220 in accordance with embodiments of the present invention. As above, resistive switching memory element 220 includes electrode 206, NiO film 204, electrode 202, and current steering element 208. In some embodiments, a buffer layer (not shown) may be formed on NiO film 204 to provide adhesion enhancement and a diffusion barrier.

Figure 3:
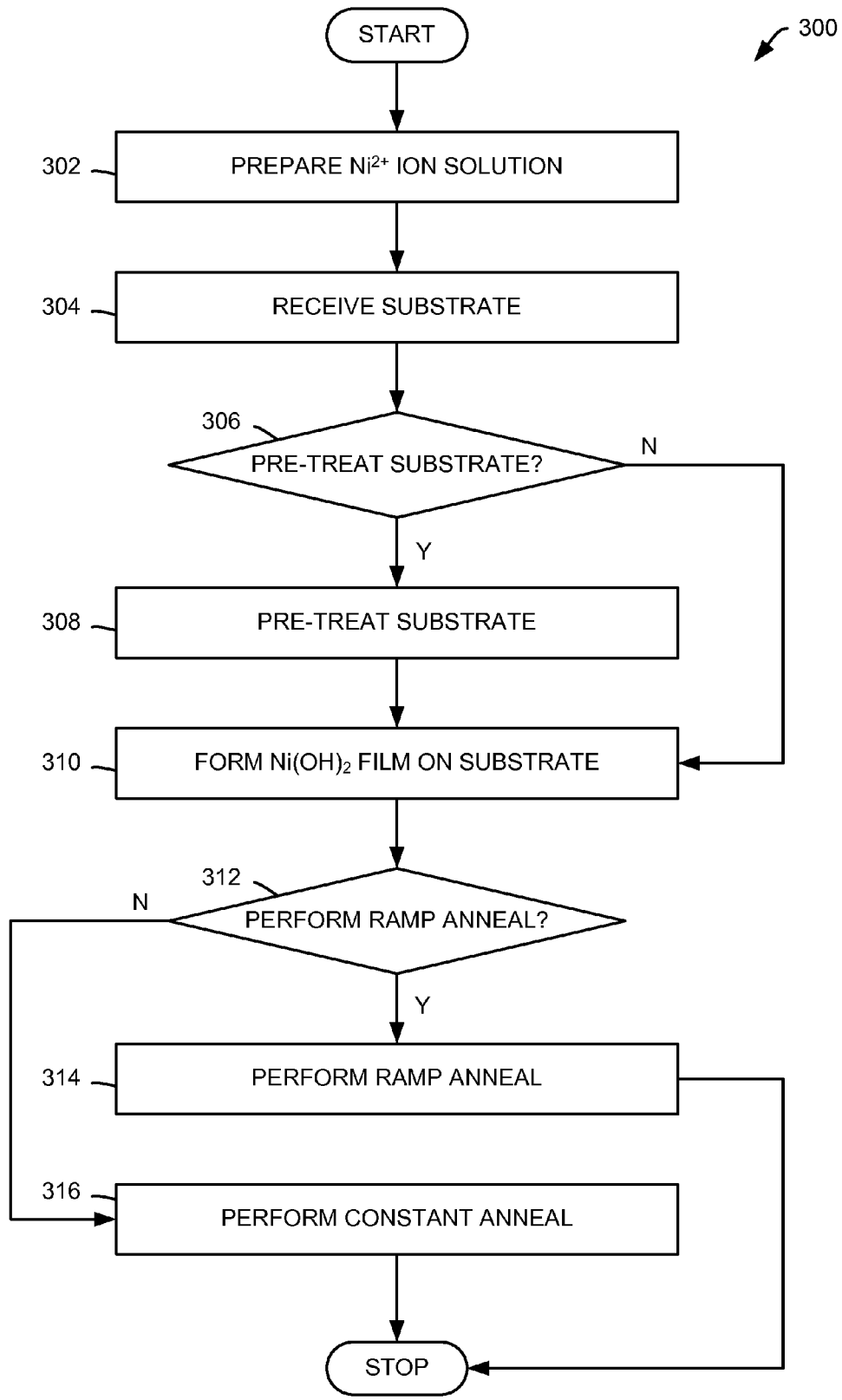
FIG. 3 is an illustrative flowchart for methods for forming a resistive switching memory element on a substrate in accordance with embodiments of the present invention.

FIG. 3 is an illustrative flowchart 300 for methods for forming a resistive switching memory element on a substrate in accordance with embodiments of the present invention. At a first step 302, a $Ni^{2+}$ ion solution is prepared. In embodiments described herein, an appropriate $Ni^{2+}$ ion solution may be prepared from a $Ni(NO_3)_2$ solution having a concentration in the range of approximately 10 mM to 2M and having an adjusted solution pH in the range of approximately 1.0 to 5.0. In some embodiments, a $Ni(NO_3)_2$ solution may be more preferably prepared having a concentration in the range of approximately 0.1M to 1M and having an adjusted solution pH in the range of approximately 3.0 to 4.0. As may be appreciated, $Ni(NO_3)_2$ solutions may be prepared in any manner well-known in the art without departing from the present invention. In addition, in some embodiments, a dopant such as Co, Li, Mg, and Cr, may be added to a $Ni(NO_3)_2$ solution without limitation. In some embodiments, dopants may be present as nitrate salts in the form of $Co(NO_3)_2$, $LiNO_3$, $Mg(NO_3)_2$, and $Cr(NO_3)_3$ having a concentration range of approximately 1.0 mM to 0.1M.

Figure 4A:
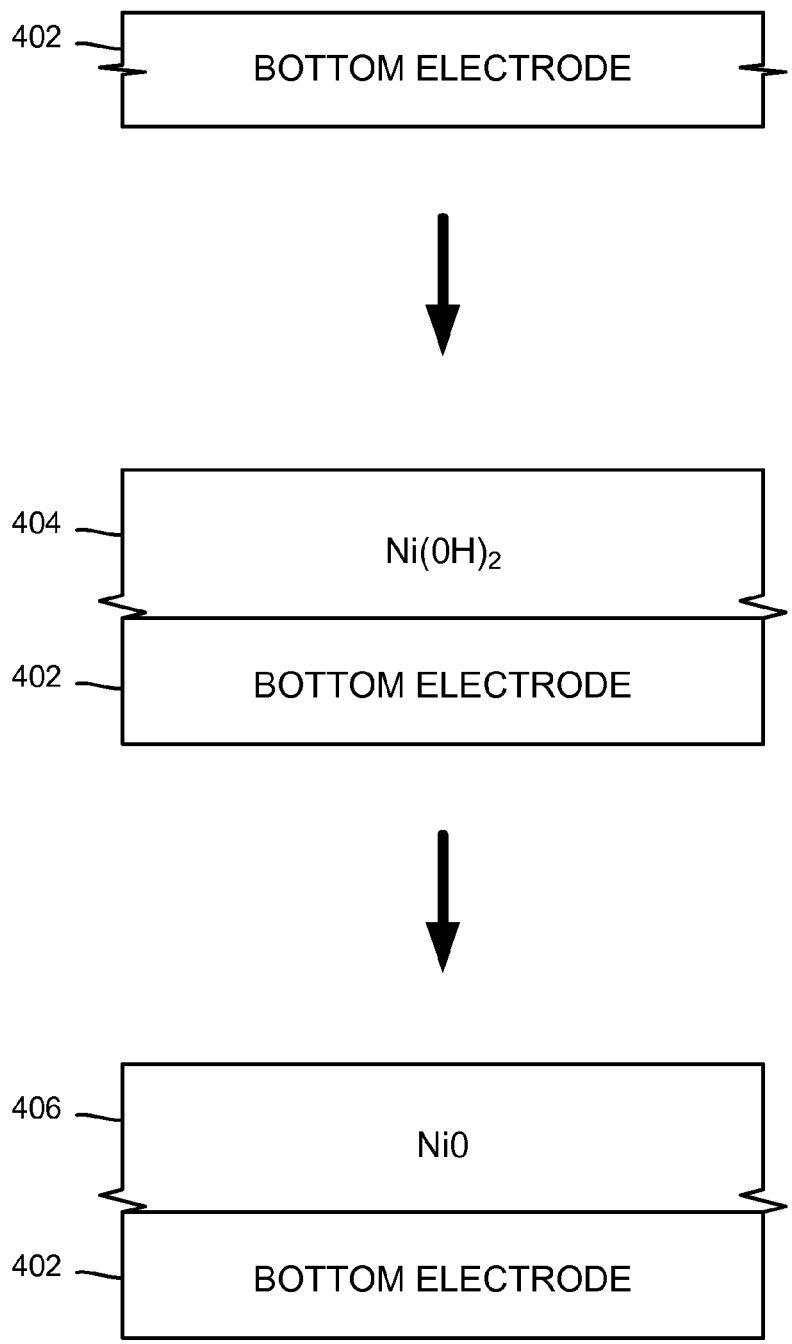
FIGS. 4A-B are illustrative representations of a build-up for a resistive switching memory element utilizing methods described herein in accordance with embodiments of the present invention.

At a next step 304, a substrate is received. A substrate may be received by any configuration capable of performing wet processes without departing from the present invention. As such, in embodiments, a substrate may be immersed in a bath, or may be sprayed in some fashion. Notably, a substrate may include a bottom electrode that may be utilized as a cathode for a subsequent electrochemical deposition step. Referring briefly to FIG. 4A, FIG. 4A is an illustrative representation of a build-up for a resistive switching memory element utilizing methods described herein in accordance with embodiments of the present invention. Thus, a substrate may include a bottom electrode 402 as illustrated. Returning to FIG. 3, at a next step 306, the method determines whether to pre-treat the substrate. A substrate may be pre-treated to enhance adhesion of subsequent layers. If the method determines at a step 306 not to pre-treat the substrate, the method continues to a step 310 to form a $Ni(OH)_2$ film on the substrate. If the method determines at a step 306 to pre-treat the substrate, the method continues to a step 308 to pre-treat the substrate. In some embodiments, pre-treating may include a chemical cleaning or an electrochemical cleaning. Thus, in some embodiments, a chemical cleaning may be performed that includes washing the substrate in an $H_2SO_4$ solution for 30 to 120 seconds (s), where the $H_2SO_4$ solution has a concentration in the range of 0.5 to 2.0 M, and where the solution is maintained at room temperature. In some embodiments, a chemical cleaning may be performed that includes washing the substrate in an $H_2SO_4$ and $HNO_3$ solution for 10 to 60 s, where the $H_2SO_4$ and $HNO_3$ solution has an $H_2SO_4$ concentration of 0.5 to 2.0 M and an $HNO_3$ concentration in a range of 0.1 to 1.0 M, and where the solution is maintained at room temperature.

In some embodiments, an electrochemical cleaning may be performed that includes performing an in-situ cathodic reduction in a deposition bath at a potential of −0.4 to −0.7 volts (V) vs. Ag/AgCl (sat. KCl) for 10 to 60 s. In some embodiments, an electrochemical cleaning may be performed that includes performing a cathodic reduction in an $H_2SO_4$ solution at a potential of approximately −0.4 to −0.7V vs. Ag/AgCl (sat. KCl) for 10 to 60 s where the $H_2SO_4$ solution has a concentration of 0.1 to 1.0 M. As may be appreciated, selection of a chemical cleaning or an electrochemical cleaning may be made on the basis of compatible chemistries without departing from the present invention.

At a next step 310, the method continues to form a $Ni(OH)_2$ film on a substrate. In some embodiments, a $Ni(OH)_2$ film may be formed on a substrate by electrochemically depositing the film on the substrate. As noted above, a substrate may include a bottom electrode that may be utilized as a cathode for a subsequent electrochemical deposition step. Referring briefly to FIG. 4A, a bottom electrode 402 is illustrated having a $Ni(OH)_2$ film 404 formed thereon. As may be appreciated, electrochemical deposition requires an anode, which, in some embodiments, is formed from a conductive material such as Ni, Pt, a Ni alloy, and a Pt alloy. In some embodiments, an electrochemical deposition process proceeds under a set of operational parameters that includes: a current density in a range of approximately 50.0 1-$A/cm^2$ to 2.0 $mA/cm^2$; a peak current of approximately 0.1 to 1.0 $mA/cm^2$, the peak current including a current on/off time ratio in a range of approximately 1:10 to 10:1; and a current scan range of approximately 0.05 to 2.00 mA/cm². In some embodiments, the set of operational parameters more preferably includes: a current density of approximately 0.1 to 0.5 mA/cm²; and a current scan range of approximately 50.0 1-A/cm² to 0.5 mA/cm².

In other embodiments, an electrochemical deposition may further include utilizing a reference electrode for use with a potential control waveform. In some embodiments, a potential control waveform proceeds under a set of operational parameters including: an applied potential selected to induce a current flow of approximately 50.0 1-A/cm² to 2.0 mA/cm²; and a potential scan range selected to induce a current flow of approximately 0.05 to 2.00 mA/cm². In some embodiments, the set of operational parameters more preferably includes: an applied potential selected to induce a current flow of approximately 0.1 to 0.5 mA/cm². Furthermore, in some embodiments, the reference electrode may include: a hydrogen reference electrode, an Ag/AgCl reference electrode, and a Pt wire pseudo reference electrode. The method then continues to anneal the $Ni(OH)_2$ film.

In some embodiments, co-depositing other materials utilizing techniques described above may be performed. For example, in one embodiment, a Co salt may be co-deposited to form a mixed layer of $Co(OH)_2/Ni(OH)_2$. The mixed layer of $Co(OH)_2/Ni(OH)_2$ may then be annealed to form a mixed cobalt oxide and nickel oxide layer. Other mixtures are possible as well without departing from the present invention.

Figure 5:
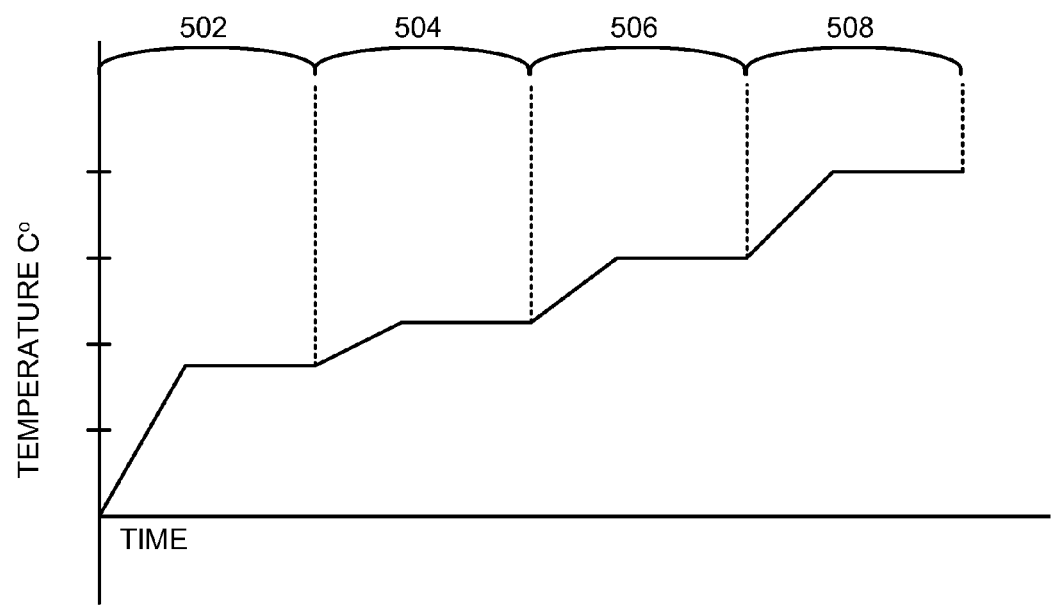
FIG. 5 is an illustrative graphical representation of a ramp anneal in accordance with embodiments of the present invention.

An anneal process may be utilized to convert the $Ni(OH)_2$ film to an NiO film by thermal decomposition of the $Ni(OH)_2$ film 406 as illustrated in FIG. 4A. Two types of annealing may be favorably utilized in embodiments disclosed herein: ramp annealing and constant annealing. Returning to FIG. 3, at a next step 312, the method determines whether to perform a ramp anneal. If the method determines at a step 312 to perform a ramp anneal, the method continues to a step 314 to perform a ramp anneal of a $Ni(OH)_2$ film formed on a substrate. Referring briefly to FIG. 5, FIG. 5 is an illustrative graphical representation 500 of a ramp anneal in accordance with embodiments of the present invention. In some embodiments, a ramp anneal may be performed in four segments. In a first segment 502, the ramp anneal is performed at a temperature of approximately 250 to 350° C. with a ramp rate of approximately 0.1 to 20° C./sec and a holding temperature of approximately 350° C. for approximately 30 to 300 s. In a second segment 504, the ramp anneal is performed at a temperature of approximately 350 to 450° C. with a ramp rate of approximately 0.1 to 20° C./sec and a holding temperature of approximately 450° C. for approximately 30 to 300 s. In a third segment 506, the ramp anneal is performed at a temperature of approximately 450 to 600° C. with a ramp rate of approximately 0.1 to 20° C./sec and a holding temperature of approximately 600° C. for approximately 30 to 300 s. In a fourth segment 508, the ramp anneal is performed at a temperature of approximately 600 to 800° C. with a ramp rate of approximately 0.1 to 20° C./sec and a holding temperature of approximately 800° C. for approximately 30 to 300 s.

Returning to FIG. 3, if the method determines at a step 312 not to perform a ramp anneal, the method continues to a step 316 to perform a constant anneal. In some embodiments, a constant anneal is performed at a temperature of approximately 250 to 800° C. for approximately 10 to 600 s. In some embodiments, methods may include combinations of a ramp anneal and a constant anneal. Thus, in one embodiments, a ramp anneal may be performed followed by a constant anneal. In another embodiment, a constant anneal may be performed followed by a ramp anneal. After the method completes conversion of the $Ni(OH)_2$ film to an NiO film by thermal decomposition (i.e. annealing), the method ends.

Figure 4B:
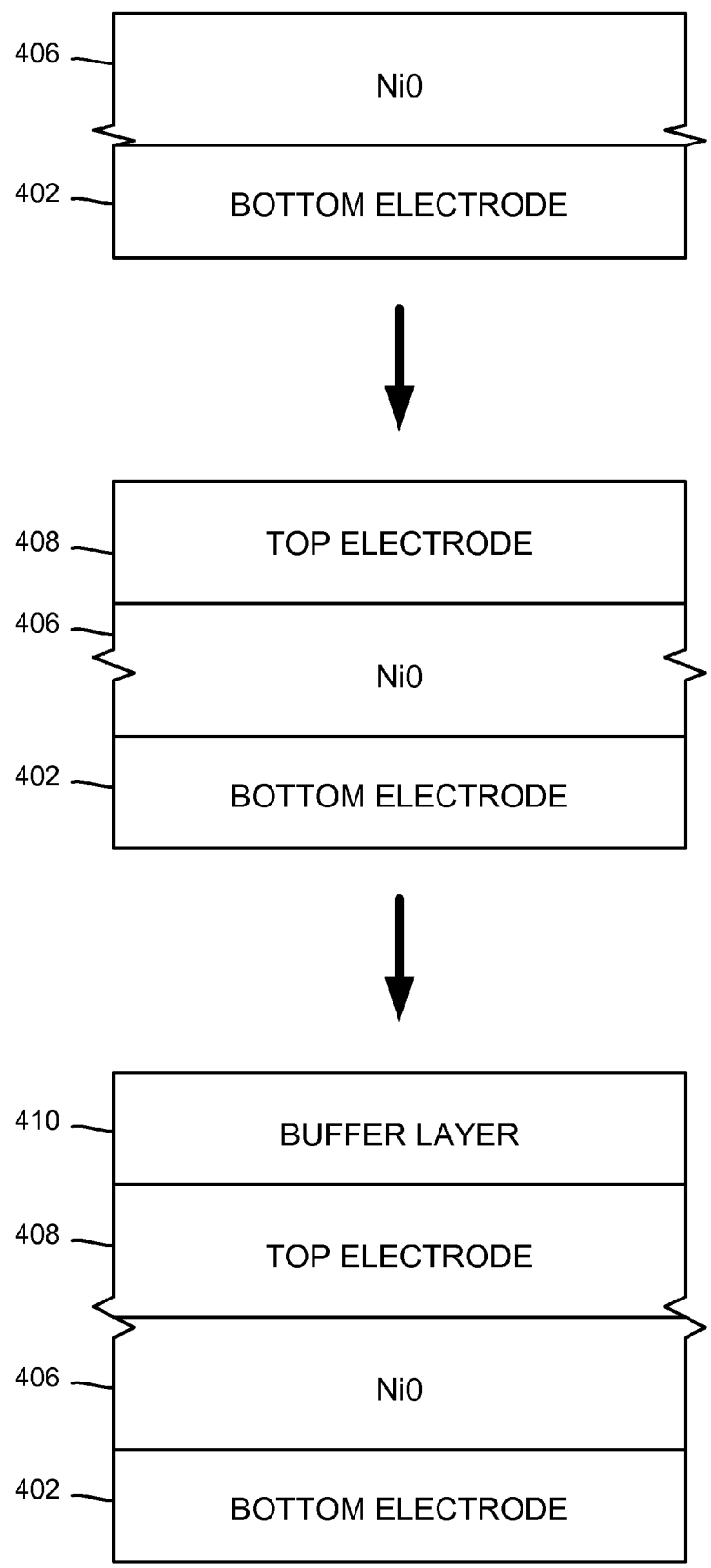

FIG. 4B is an illustrative representation of a build-up for a resistive switching memory element utilizing methods described herein in accordance with embodiments of the present invention. As noted above for FIG. 3, bottom electrode 402 may be utilized as a cathode for an electrochemical deposition of a $Ni(OH)_2$ film. A $Ni(OH)_2$ film may then be converted to NiO film 406 by thermal decomposition. In some embodiments, top electrode 408 may then be formed upon NiO film 406. Top electrodes may be formed on a NiO film in any manner well-known in the art without departing from the present invention. In some embodiments, electrodes may be formed from Ni, Pt, Ir, Ti, Al, Cu, Co, Ru, Rh, and their alloys. It may be appreciated that electrodes 402 and 408 may be formed in any manner well-known in the art without departing from the present invention including: PVD, CVD, ALD, ECP, and Electroless deposition techniques. In addition, in some embodiments, NiO film 406 may include a dopant or alloying element such as Co, Li, Mg, and Cr. Dopants, as may be appreciated, may be selected to provide specific and desired switching characteristics for a memory device. In some embodiments, buffer layer 410 may be formed on top electrode 408 to provide adhesion enhancement and diffusion barrier. As above, buffer layers may be formed on top electrodes in any manner well-known in the art without departing from the present invention.

While this invention has been described in terms of several embodiments, there are alterations, permutations, and equivalents, which fall within the scope of this invention. It should also be noted that there are many alternative ways of implementing the methods and apparatuses of the present invention. Furthermore, unless explicitly stated, any method embodiments described herein are not constrained to a particular order or sequence. Further, the Abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A method of forming a resistive switching memory element, the method comprising;
   receiving a substrate comprising a bottom electrode;
   forming a nickel hydroxide film over the bottom electrode using electrochemical deposition;
   annealing the nickel hydroxide film to form a nickel oxide film; and
   forming a top electrode over the nickel oxide,
     wherein the nickel oxide film is capable of being switched between two different resistive states by applying a predetermined voltage between the top electrode and the bottom electrode.

2. The method of claim 1, wherein the top electrode and the bottom electrode comprise one or more of Ni, Pt, Ir, Ti, Al, Cu, Co, Ru, Rh, or alloys thereof.

3. The method of claim 1, wherein the nickel oxide film comprises one of a dopant or an alloying element.

4. The method of claim 1, wherein a dopant is introduced into the nickel hydroxide film during the forming of the nickel hydroxide film using electrochemical deposition.

5. The method of claim 1, wherein the nickel oxide film comprises one or more of Co, Li, Mg, and Cr.

6. The method of claim 1, wherein the top electrode is formed using one of PVD, CVD, ALD, ECP, or electroless deposition.

7. The method of claim 1, further comprising forming a buffer layer over the nickel oxide layer and under the top electrode, wherein the buffer layer enhances adhesion between the nickel oxide layer and the top electrode.

8. The method of claim 1, further comprising forming a buffer layer over the nickel oxide layer and under the top electrode, wherein the buffer layer operates as a diffusion barrier between the nickel oxide layer and the top electrode.

9. The method of claim 1, wherein the substrate comprises a current steering element in electrical communication with the bottom electrode.

10. The method of claim 1, wherein the current steering element comprises one of a diode, a resistor, or a transistor.

11. The method of claim 1, wherein the forming of the nickel hydroxide film using electrochemical deposition comprises contacting the bottom electrode with a solution comprising nitrogen ions.

12. The method of claim 11, wherein the solution comprises a dissolved $Ni(NO_3)_2$ at a concentration of between about 10 mM to 2M.

13. The method of claim 11, wherein the solution has a pH of about 1.0 to 5.0.

14. The method of claim 1, wherein the bottom electrode is used as a cathode during the forming of the nickel hydroxide film using electrochemical deposition.

15. The method of claim 14, wherein the forming of the nickel hydroxide film using electrochemical deposition comprises applying a current density within a range from about 50.0 $\mu A/cm^2$ to about 2.0 $mA/cm^2$ to the bottom electrode.

16. The method of claim 1, further comprising pre-treating the substrate in an H2SO4 solution.

17. The method of claim 16, wherein the H2SO4 solution has an H2SO4 concentration within a range from about 0.5 M to about 2.0 M.

18. The method of claim 16, wherein the H2SO4 solution is maintained at approximately room temperature.

19. The method of claim 1, wherein the annealing comprises performing a constant anneal performed at a temperature within a range from about 250° C. to about 800° C. for a time period within a range from about 10 seconds to about 600 seconds.

20. The method of claim 1, wherein the annealing comprises performing a ramp anneal performed in at least four segments, further comprising:
   performing a first segment at a first temperature within a range from about 250° C. to about 350° C. at a first ramp rate within a range from about 0.1° C./sec to about 20° C./sec and a first holding temperature of approximately 350° C. for a time period within a range from about 30 seconds to about 300 seconds;
   performing a second segment at a second temperature within a range from about 350° C. to about 450° C. at a second ramp rate within a range from about 0.1° C./sec to about 20° C./sec and a second holding temperature of approximately 450° C. for a time period within a range from about 30 seconds to about 300 seconds;
   performing a third segment at a third temperature within a range from about 450° C. to about 600° C. at a third ramp rate within a range from about 0.1° C./sec to about 20° C./sec and a third holding temperature of approximately 600° C. for a time period within a range from about 30 seconds to about 300 seconds; and
   performing a fourth segment at a fourth temperature within a range from about 600° C. to about 800° C. at a fourth ramp rate within a range from about 0.1° C./sec to about 20° C./sec and a fourth holding temperature of approximately 800° C. for a time period within a range from about 30 seconds to about 300 seconds.

* * * * *